(12) United States Patent
Nakazato et al.

(10) Patent No.: US 9,857,203 B2
(45) Date of Patent: Jan. 2, 2018

(54) RESOLVER DEVICE

(71) Applicant: JAPAN AVIATION ELECTRONICS INDUSTRY, LIMITED, Tokyo (JP)

(72) Inventors: Kenichi Nakazato, Tokyo (JP); Yoshiyuki Kobayashi, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 15/536,797

(22) PCT Filed: Nov. 24, 2015

(86) PCT No.: PCT/JP2015/082906
§ 371 (c)(1),
(2) Date: Jun. 16, 2017

(87) PCT Pub. No.: WO2016/139849
PCT Pub. Date: Sep. 9, 2016

(65) Prior Publication Data
US 2017/0343384 A1    Nov. 30, 2017

(30) Foreign Application Priority Data

Mar. 5, 2015 (JP) ................................ 2015-043172

(51) Int. Cl.
*H03M 1/48* (2006.01)
*G01D 5/20* (2006.01)
(Continued)

(52) U.S. Cl.
CPC ............... *G01D 5/20* (2013.01); *G01B 21/22* (2013.01); *G01D 5/24476* (2013.01); *H03M 1/485* (2013.01)

(58) Field of Classification Search
CPC ... H03M 1/485; G01B 21/22; G01D 5/24476; G01D 5/20
(Continued)

(56) References Cited

U.S. PATENT DOCUMENTS 6,891,492 B1   5/2005 Kushihara
7,895,010 B2 * 2/2011 Yokokawa ........... G01D 5/2073
                                                   702/104
(Continued)

FOREIGN PATENT DOCUMENTS

JP   2006-017659    1/2006
JP   2007-052001    3/2007
(Continued)

OTHER PUBLICATIONS

International Search Report, dated Feb. 23, 2016 by the Japan Patent Office (JPO), for the corresponding International Application No. PCT/JP2015/082906.

*Primary Examiner* — Jean B Jeanglaude
(74) *Attorney, Agent, or Firm* — Greenblum & Bernstein, P.L.C.

(57) ABSTRACT

An n-th-harmonic error estimation unit that estimates the error component of an n-th harmonic included in a resolver angle θ and a subtraction unit that subtracts an n-th-harmonic estimated angle error from θ to output the corrected angle θ' are included. The n-th-harmonic error estimation unit includes an n-th-harmonic error phase detection unit that obtains a phase difference u such that the integral, for a 1/n period of an electrical angle of the rotor, of the output obtained by synchronously detecting θ by using a rectangular wave obtained by comparison from a COS wave expressed as cos(nθ+u) becomes zero and generates a SIN wave expressed as sin(nθ+u); a synchronous detector that synchronously detects θ' by using a rectangular wave obtained by comparison from the SIN wave; an integrator
(Continued)

that integrates the detected output for a 1/n period of the electrical angle; an actual angle integral calculation unit; an amplitude setter that sets an error amplitude from the value obtained by subtracting the integral of the actual angle integral calculation unit from the integral of the integrator; and a multiplier that generates the n-th-harmonic estimated angle error by multiplying the SIN wave by the error amplitude.

4 Claims, 10 Drawing Sheets

(51) Int. Cl.
  *G01D 5/244* (2006.01)
  *G01B 21/22* (2006.01)

(58) Field of Classification Search
  USPC ..................................... 341/115; 324/207.15
  See application file for complete search history.

(56) References Cited

U.S. PATENT DOCUMENTS

| | | | |
|---|---|---|---|
| 8,344,723 B2* | 1/2013 | Kamiya | G01B 7/30 324/207.15 |
| 9,413,279 B2* | 8/2016 | Rho | H02P 6/16 |
| 2007/0029955 A1 | 2/2007 | Kanekawa et al. | |
| 2010/0176975 A1 | 7/2010 | Nakazato et al. | |
| 2012/0143549 A1 | 6/2012 | Ihm et al. | |
| 2013/0307447 A1* | 11/2013 | Rozman | G05B 11/01 318/400.02 |
| 2014/0300306 A1 | 10/2014 | Kato | |
| 2016/0087561 A1* | 3/2016 | Rho | H02P 6/16 318/400.04 |

FOREIGN PATENT DOCUMENTS

| | | |
|---|---|---|
| JP | 2010-164426 | 7/2010 |
| JP | 2012-118049 | 6/2012 |
| JP | 2013-057590 | 3/2013 |
| JP | 2013-221827 | 10/2013 |
| JP | 2013-238431 | 11/2013 |

* cited by examiner

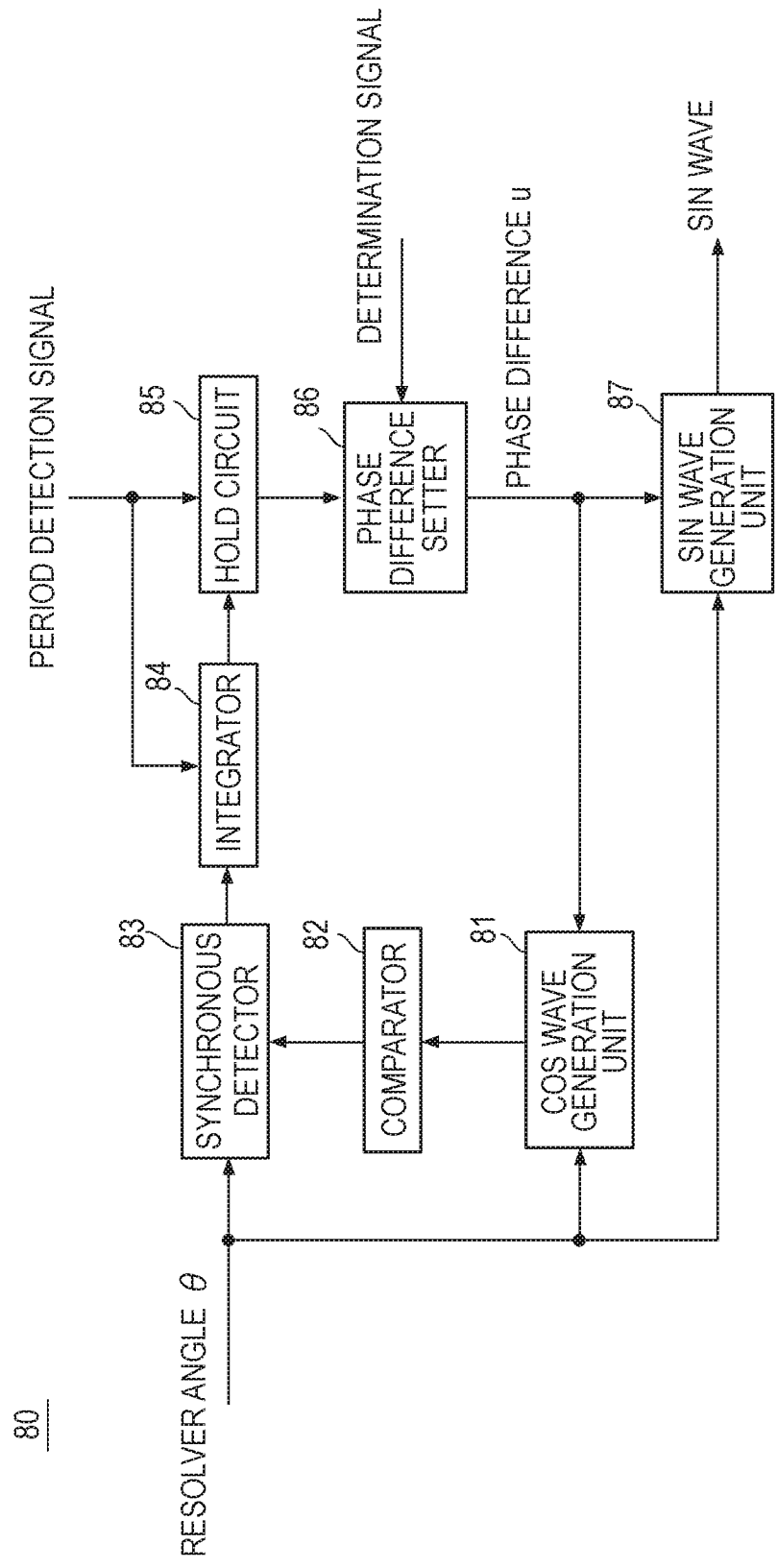

RESOLVER DEVICE

TECHNICAL FIELD

The present invention relates to a resolver device that detects a rotation angle of a rotor.

BACKGROUND ART

FIG. 1 shows a configuration disclosed in Patent Literature 1 as a conventional example of a resolver device. The resolver device includes a resolver 11 that detects a rotation angle of the rotor, an excitation unit 12 that applies an excitation signal to the resolver 11, an output signal conversion unit 13 that converts the output signals of the resolver 11 to digital signals, and a computation unit 14 that corrects the rotation angle of the resolver 11 by using converted phase information of the resolver 11.

The resolver 11 is of a 1-phase excitation and 2-phase output type; both the output signals (SIN signal, COS signal) and the excitation signal are input to the output signal conversion unit 13; and the output signal conversion unit 13 generates digital signals that indicate phase information and zero-point information, from the excitation signal, the SIN signal, and the COS signal. The phase information and the zero-point information are input to the computation unit 14. The phase information contains an error relative to the actual rotation angle of the rotor.

FIG. 2 is a block diagram showing a control block of the computation unit 14. The computation unit 14 includes an error information table 20, an initialization processing unit 21, a revolution determination unit 22, a rotation period calculation unit 23, a uniform-velocity-rotation determination unit 24, a predicted rotation angle calculation unit 25, a resolver error calculation unit 26, and a corrected rotation angle calculation unit 27.

The error information table 20 can store a resolver error $\theta e$, which is the difference between a predicted rotation angle $\theta p$ and the rotation angle $\theta r$ in the phase information obtained while the resolver 11 is rotating at a uniform velocity, for each rotation angle of the resolver 11, and the initialization processing unit 21 sets the initial value of the resolver error $\theta e$ in the error information table 20.

The revolution determination unit 22 determines from a pulse signal of zero-point information whether the number of revolutions of the resolver 11 is greater than or equal to a predetermined number of revolutions, the rotation period calculation unit 23 calculates the rotation period, and the uniform-velocity-rotation determination unit 24 determines whether the resolver 11 is rotating at a uniform velocity. The predicted rotation angle calculation unit 25 calculates the predicted rotation angle $\theta p$ while the resolver 11 is rotating at a uniform velocity.

The resolver error calculation unit 26 calculates the resolver error $\theta e$ while the resolver 11 is rotating at a uniform velocity, subjects the calculated resolver error $\theta e$ to low-pass filtering, and updates the error information table 20. The resolver error $\theta e$ is calculated for each rotation angle of the resolver 11.

The corrected rotation angle calculation unit 27 calculates a corrected rotation angle $\theta a$ of the resolver 11 by adding or subtracting the resolver error $\theta e$ stored in the error information table 20 to or from the rotation angle $\theta r$ in the phase information. The corrected rotation angle $\theta a$ is calculated for each rotation angle of the resolver 11. The calculated corrected rotation angle $\theta a$ is output to a power converter 15. In FIG. 2, a reference numeral 16 denotes a motor driven by the power converter 15.

PRIOR ART LITERATURE

Patent Literature

Patent Literature 1: Japanese Patent Application Laid Open No. 2013-238431

SUMMARY OF THE INVENTION

Problems to be Solved by the Invention

The resolver device described above calculates the corrected rotation angle $\theta a$ of the resolver 11 by using the resolver error $\theta e$ stored in the error information table 20 and can correct an error included in the rotation angle $\theta r$ of the resolver 11 even while the resolver 11 is accelerating or decelerating.

However, since the resolver error $\theta e$ is stored for each rotation angle of the resolver 11, there is a problem in which a very large storage area is required as the error information table 20.

An object of the present invention is to provide a resolver device which corrects an angle error and enables high-precision angle detection without the need for a large storage area.

Means to Solve the Problems

According to a first aspect of the present invention, a resolver device includes: a resolver; an excitation circuit adapted to apply an excitation signal to the resolver; an angle calculation unit adapted to calculate a resolver angle $\theta$ from output signals of the resolver; an n-th-harmonic error estimation unit adapted to estimate an error component of an n-th (n>0) harmonic included in the resolver angle $\theta$; and a subtraction unit adapted to subtract an n-th-harmonic estimated angle error estimated by the n-th-harmonic error estimation unit from the resolver angle $\theta$ and to output a corrected angle $\theta'$. The n-th-harmonic error estimation unit includes: an n-th-harmonic error phase detection unit adapted to obtain a phase difference u such that an integral, for a 1/n period of an electrical angle, of a detected output obtained by synchronously detecting the resolver angle $\theta$ by using a rectangular wave obtained by comparison from a COS wave expressed as $\cos(n\theta+u)$ becomes zero, and to generate and output a SIN wave expressed as $\sin(n\theta+u)$ from the obtained u; a comparator adapted to do comparison with the SIN wave; a synchronous detector adapted to synchronously detect the corrected angle $\theta'$ by using a rectangular wave output from the comparator; an integrator adapted to integrate a detected output of the synchronous detector for a 1/n period of the electrical angle; an actual angle integral calculation unit adapted to calculate an integral, for a 1/n period of the electrical angle, of a detected output obtained by synchronously detecting an actual angle, assuming that the resolver angle $\theta$ has no error, by using the rectangular wave output from the comparator; a subtractor adapted to subtract the integral of the actual angle integral calculation unit from an integral of the integrator; an amplitude setter adapted to set an error amplitude from an output of the subtractor; and a multiplier adapted to generate and output the n-th-harmonic estimated angle error by multiplying the SIN wave by the error amplitude. The u and the error amplitude are updated when the resolver is rotating at a uniform velocity greater than or equal to a predetermined number of revolutions.

According to a second aspect of the present invention, a resolver device includes: a resolver; an excitation circuit adapted to apply an excitation signal to the resolver; an angle calculation unit adapted to calculate a resolver angle θ from output signals of the resolver; an n-th-harmonic error estimation unit adapted to estimate an error component of an n-th (n>0) harmonic included in the resolver angle θ; and a subtraction unit adapted to subtract an n-th-harmonic estimated angle error estimated by the n-th-harmonic error estimation unit from the resolver angle θ and to output a corrected angle θ'. The n-th-harmonic error estimation unit includes: a first integrator adapted to integrate an angular velocity obtained from the angle calculation unit to calculate an actual angle; a first subtractor adapted to subtract the actual angle from the resolver angle θ to calculate a resolver angle error; an n-th-harmonic error phase detection unit adapted to obtain a phase difference u such that an integral, for a 1/n period of an electrical angle, of a detected output obtained by synchronously detecting the resolver angle error by using a rectangular wave obtained by comparison from a COS wave expressed as cos(nθ+u) becomes zero, and to generate and output a SIN wave expressed as sin(nθ+u) from the obtained u; a comparator adapted to do comparison with the SIN wave; a second subtractor adapted to subtract the actual angle from the corrected angle θ' to calculate a corrected angle error; a synchronous detector adapted to synchronously detect the corrected angle error by using a rectangular wave output from the comparator; a second integrator adapted to integrate a detected output of the synchronous detector for a 1/n period of the electrical angle; an amplitude setter adapted to set an error amplitude from an integral of the second integrator; and a multiplier adapted to generate and output the n-th-harmonic estimated angle error by multiplying the SIN wave by the error amplitude. The u and the error amplitude are updated when the resolver is rotating at a uniform velocity greater than or equal to a predetermined number of revolutions.

Effects of the Invention

According to the present invention, an angle error is corrected by generating an error waveform through real-time estimation of the amplitude and phase of the angle error and by subtracting it from the resolver angle θ. Therefore, the angle error correction can be performed without the need for a large storage area.

If the angle error is corrected for each frequency component, extremely-high-precision angle detection becomes possible.

BRIEF DESCRIPTION OF THE DRAWINGS

FIG. 5 is a block diagram showing details of an n-th-harmonic error phase detection unit shown in FIG. 4;

DETAILED DESCRIPTION OF THE EMBODIMENTS

Embodiments of the present invention will be described below.

First Embodiment

Figure 1:
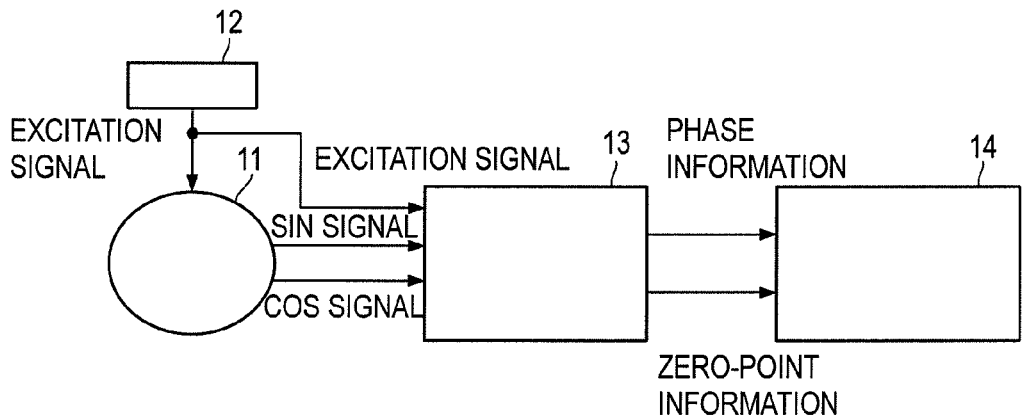
FIG. 1 is a block diagram showing an example configuration of a conventional resolver device.
Figure 2:
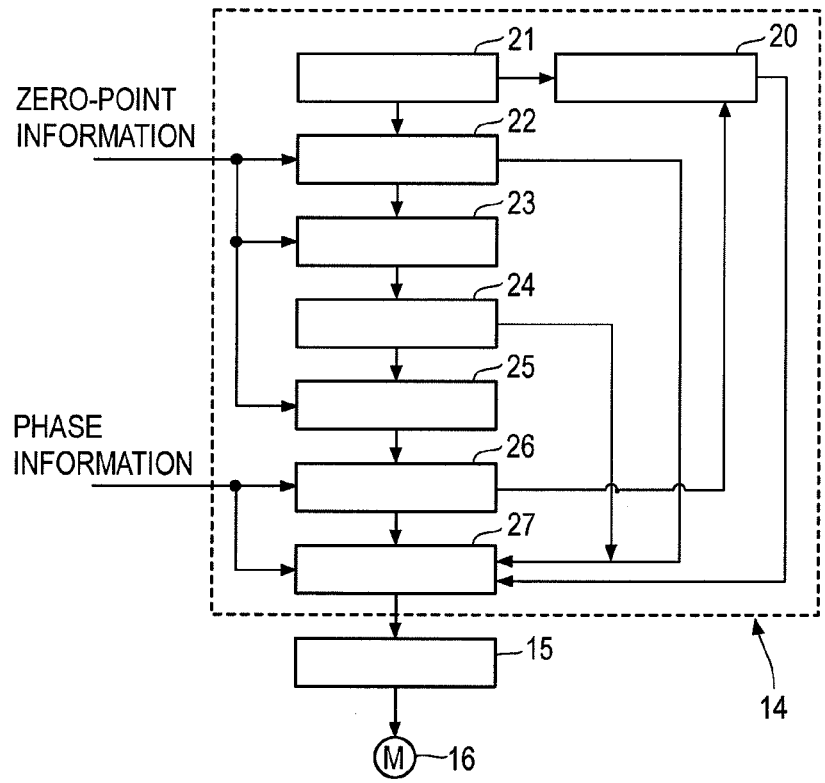
FIG. 2 is a block diagram showing details of a computation unit shown in FIG. 1.
Figure 3:
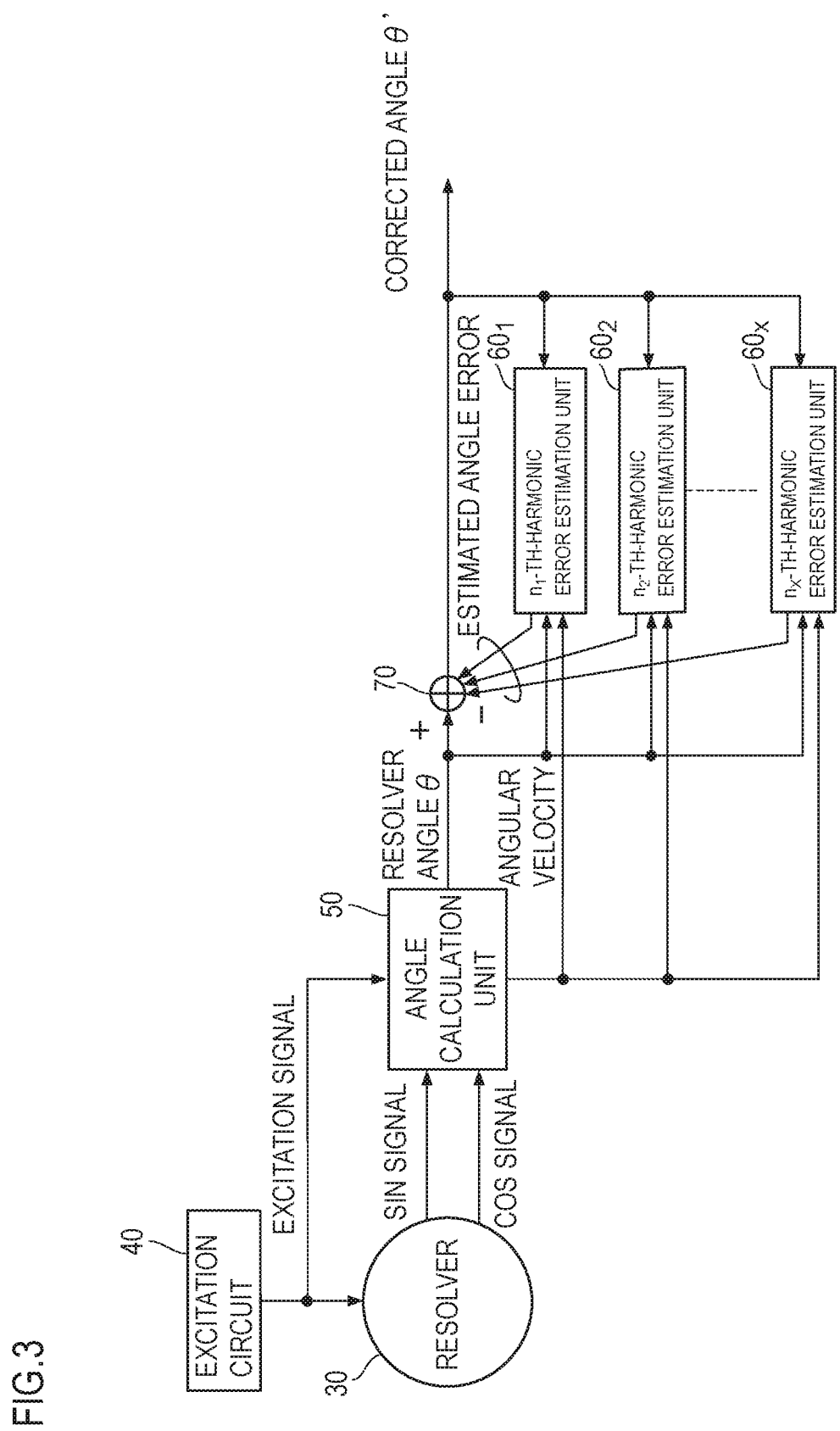
FIG. 3 is a block diagram showing an overview of the functional configuration of a resolver device according to an embodiment of the present invention.

FIG. 3 shows an overview of the configuration of a resolver device according to a first embodiment of the present invention. The resolver device includes a resolver 30, an excitation circuit 40 that applies an excitation signal to the resolver 30, and an angle calculation unit 50 that calculates a resolver angle θ from the output signals of the resolver 30, and further includes a plurality of n-th-harmonic error estimation units 60 and a subtraction unit 70. Each of the n-th-harmonic error estimation units 60 estimates the error component of an n-th (n>0) harmonic included in the resolver angle θ. The n values vary and are identified in FIG. 3 by adding subscripts 1, 2, and x to n and also to the reference numeral 60.

The resolver 30 is of a 1-phase excitation and 2-phase output type, for example, and its output signals, which are a SIN signal and a COS signal, are input to the angle calculation unit 50. The excitation signal is also input to the angle calculation unit 50 from the excitation circuit 40. The angle calculation unit 50 executes, for example, a conventionally-known tracking-loop angle calculation method.

The resolver angle θ and n-th-harmonic estimated angle errors estimated respectively by the n-th ($n_1$, $n_2$, . . . , $n_x$) harmonic error estimation units $60_1$, $60_2$, . . . , $60_x$ are input to the subtraction unit 70. The subtraction unit 70 subtracts the n-th-harmonic estimated angle errors from the resolver angle θ and outputs a corrected angle θ'. The resolver angle θ and an angular velocity are input to the n-th ($n_1$, $n_2$, . . . , $n_x$) harmonic error estimation units $60_1$, $60_2$, . . . , $60_x$ from the angle calculation unit 50, and the corrected angle θ' output from the subtraction unit 70 is also input thereto.

Figure 4:
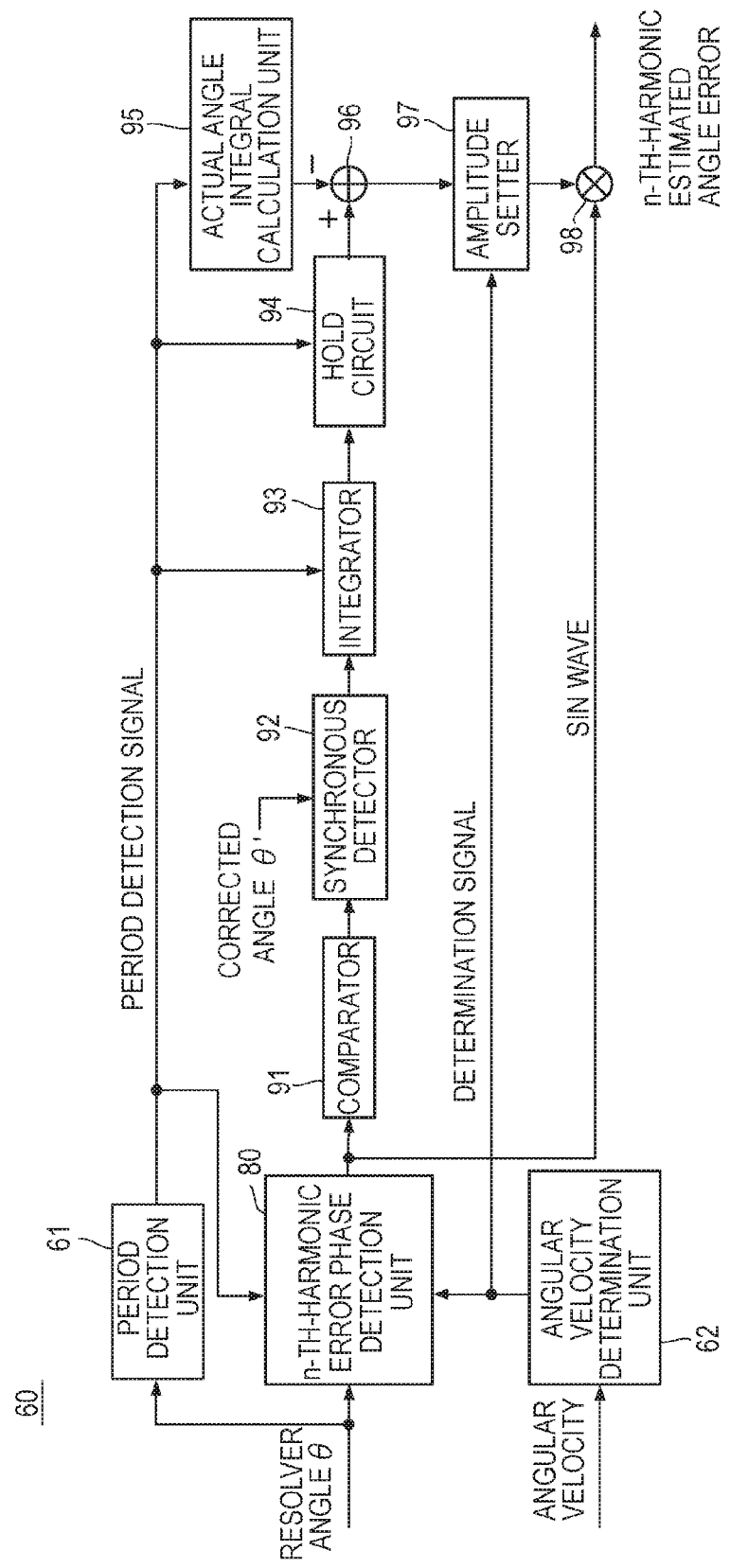
FIG. 4 is a block diagram showing an example configuration of an n-th-harmonic error estimation unit shown in FIG. 3.

FIG. 4 shows the configuration of the n-th-harmonic error estimation unit 60. The n-th-harmonic error estimation unit 60 includes a period detection unit 61, an angular velocity determination unit 62, an n-th-harmonic error phase detection unit 80, a comparator 91, a synchronous detector 92, an integrator 93, a hold circuit 94, an actual angle integral calculation unit 95, a subtractor 96, an amplitude setter 97, and a multiplier 98.

The resolver angle θ is input to the period detection unit 61. When the resolver angle θ is 0°, the period detection unit 61 outputs a period detection signal. The period detection signal is input to the n-th-harmonic error phase detection unit 80, the integrator 93, the hold circuit 94, and the actual angle integral calculation unit 95.

The angular velocity is input to the angular velocity determination unit 62. The angular velocity determination unit 62 determines from the input angular velocity whether the resolver 30 is rotating at a uniform velocity and whether it is rotating at a high speed greater than or equal to a predetermined number of revolutions. When the velocity is uniform and is greater than or equal to the predetermined number of revolutions, the angular velocity determination unit 62 outputs a determination signal of 1. Otherwise, the angular velocity determination unit 62 outputs a determination signal of 0. The determination signal is input to the n-th-harmonic error phase detection unit 80 and the amplitude setter 97.

The n-th-harmonic error phase detection unit 80 is configured as shown in FIG. 5 and includes a COS wave generation unit 81, a comparator 82, a synchronous detector 83, an integrator 84, a hold circuit 85, a phase difference setter 86, and a SIN wave generation unit 87.

The resolver angle θ and a phase difference u output from the phase difference setter 86 are input to the COS wave generation unit 81. The COS wave generation unit 81 generates a COS wave expressed as cos(nθ+u) and outputs it to the comparator 82. The comparator 82 generates a rectangular wave from the input COS wave by comparison and outputs the generated rectangular wave to the synchronous detector 83. The resolver angle θ is input to the synchronous detector 83. The synchronous detector 83 synchronously detects the resolver angle θ by using the rectangular wave input from the comparator 82.

The detected output from the synchronous detector 83 is input to the integrator 84. The integrator 84 integrates the detected output for a 1/n period of the electrical angle of the rotor. The integral obtained by the integrator 84 is input to the hold circuit 85 and is held there at the timing at which the period detection signal is output. The hold output of the hold circuit 85 is updated at the timing at which the period detection signal is output and is input to the phase difference setter 86.

If the resolver angle θ is free of error, which means that the resolver angle indicates the actual angle, the integral, for a 1/n period of the electrical angle, of the detected output obtained when the resolver angle is synchronously detected by using the rectangular wave output from the comparator 82 is always zero, so that the phase difference setter 86 estimates and outputs a phase difference u such that the hold output (integral) input from the hold circuit 85 becomes zero. The phase difference u is estimated and updated when the determination signal input from the angular velocity determination unit 62 is 1. The phase difference u is the phase (phase shift) of the angle error, and the phase difference setter 86 estimates the phase difference u by PI control or PID control.

The phase difference u is input to the COS wave generation unit 81 and the SIN wave generation unit 87. The resolver angle θ is input to the SIN wave generation unit 87. The SIN wave generation unit 87 generates and outputs a SIN wave expressed as sin(nθ+u). This SIN wave is a SIN wave that allows for the phase shift of the angle error.

The SIN wave output from the SIN wave generation unit 87 is input to the comparator 91 and the multiplier 98, as shown in FIG. 4. The comparator 91 generates a rectangular wave from the input SIN wave by comparison and outputs the generated rectangular wave to the synchronous detector 92. The corrected angle θ' is input to the synchronous detector 92, and the synchronous detector 92 synchronously detects the corrected angle θ' by using the rectangular wave input from the comparator 91.

The detected output from the synchronous detector 92 is input to the integrator 93, and the integrator 93 integrates the detected output for a 1/n period of the electrical angle. The integral is input to the hold circuit 94 and is held there at the timing at which the period detection signal is output. The hold output of the hold circuit 94 is updated at the timing at which the period detection signal is output, and is input to the subtractor 96.

If the resolver angle θ is free of error, which means that the resolver angle indicates the actual angle, the integral, for a 1/n period of the electrical angle, of the detected output obtained when the resolver angle is synchronously detected by using the rectangular wave output from the comparator 91 is uniquely determined by the duration of the 1/n period of the electrical angle, as will be described later. The actual angle integral calculation unit 95 calculates this integral on the basis of the period detection signal. The calculated integral is input to the subtractor 96.

The subtractor 96 subtracts the integral calculated by the actual angle integral calculation unit 95 from the hold output (integral) input from the hold circuit 94 to obtain an integral difference and outputs it to the amplitude setter 97. This integral difference becomes the amplitude of the angle error. The amplitude setter 97 estimates an error amplitude from the input integral difference and outputs it. The error amplitude is estimated and updated when the determination signal input from the angular velocity determination unit 62 is 1.

The error amplitude set by the amplitude setter 97 is input to the multiplier 98. The multiplier 98 multiplies the SIN wave input from the n-th-harmonic error phase detection unit 80 by the error amplitude to generate an n-th-harmonic estimated angle error. Then, this n-th-harmonic estimated angle error is input to the subtraction unit 70 and is subtracted from the resolver angle θ.

FIGS. 6A to 6D and FIGS. 7A to 7C show example operation waveforms of the n-th-harmonic error estimation unit 60, described above. FIGS. 6A to 6D show, in particular, example waveforms of the n-th-harmonic error phase detection unit 80.

Figure 6A:
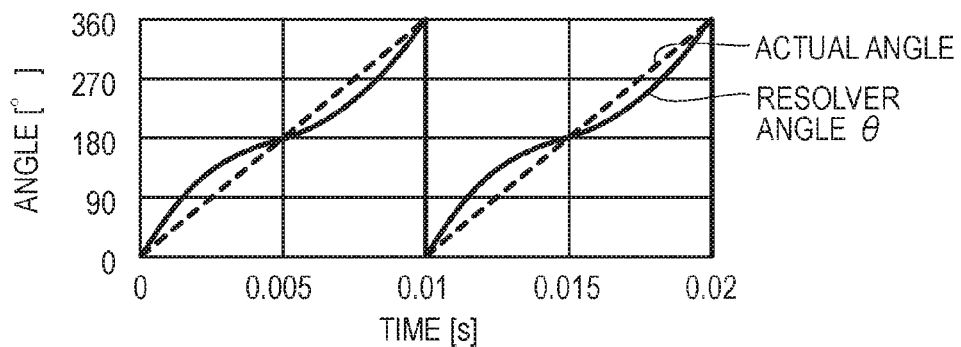
FIG. 6A is a graph showing an example operation waveform of the n-th-harmonic error phase detection unit shown in FIG. 5.

FIG. 6A shows the resolver angle θ while the resolver 30 is rotating at a uniform high velocity. The resolver angle θ has an angle error with respect to the actual angle indicated by dashed lines, as shown in FIG. 6A. Generally, a resolver angle θ of 0° does not agree with an actual angle of 0° because of the error, and a phase difference (phase shift) exists. The n-th-harmonic error phase detection unit 80 estimates that phase difference. However, the resolver angle θ free of phase difference is shown in FIG. 6A for simplicity of explanation. In this embodiment, it is shown that the resolver angle θ includes the error component of the first harmonic (fundamental wave).

Figure 6B:
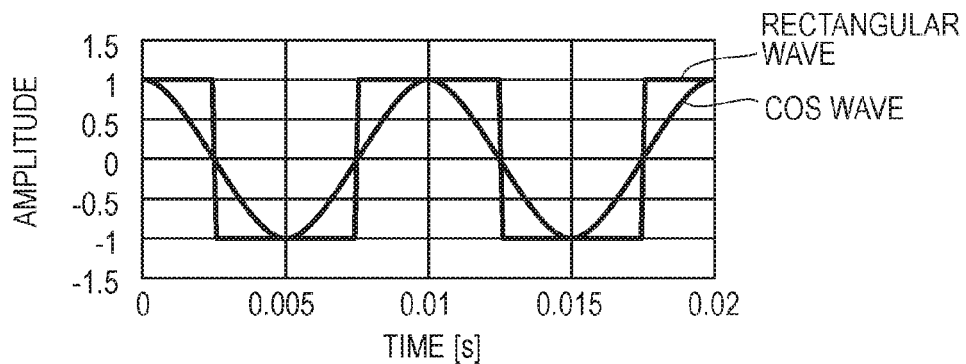
FIG. 6B is a graph showing an example operation waveform of the n-th-harmonic error phase detection unit shown in FIG. 5.
Figure 6C:
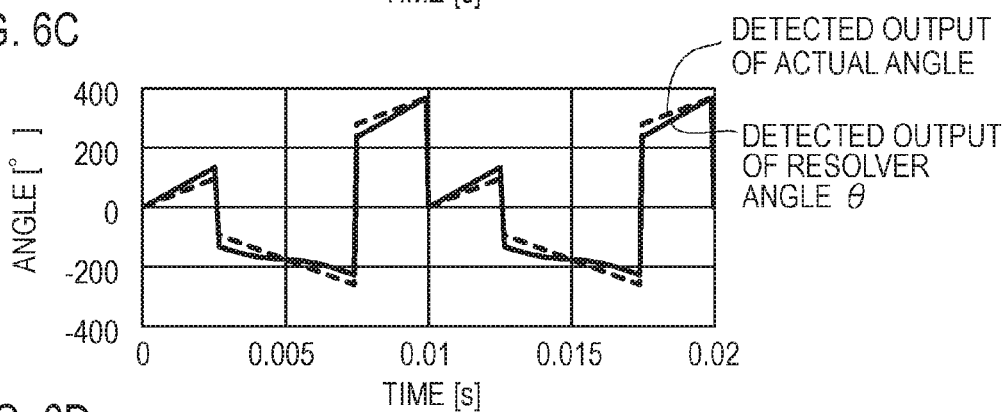
FIG. 6C is a graph showing an example operation waveform of the n-th-harmonic error phase detection unit shown in FIG. 5.
Figure 6D:
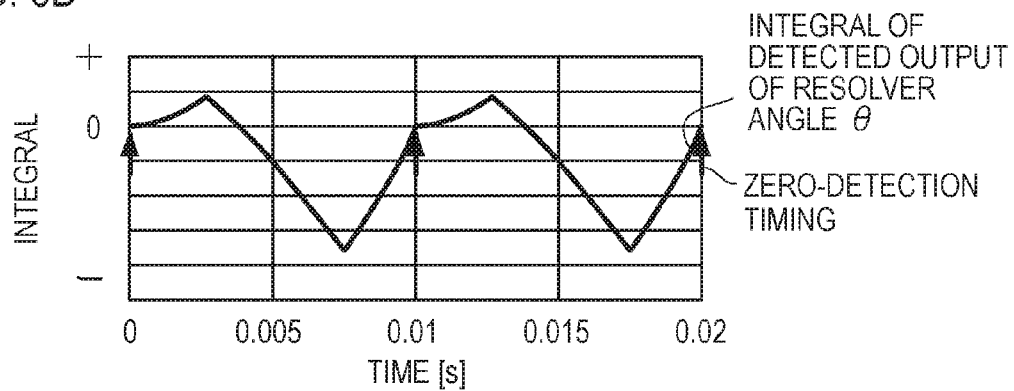
FIG. 6D is a graph showing an example operation waveform of the n-th-harmonic error phase detection unit shown in FIG. 5.

FIG. 6B shows the COS wave generated by the COS wave generation unit 81 and the rectangular wave generated by the comparator 82. FIG. 6C shows the detected output (detected output of the synchronous detector 83) of the resolver angle θ, which is obtained by synchronously detecting the resolver angle θ by using the rectangular wave, and the detected output of the actual angle is also indicated by a dashed line. FIG. 6D shows the integral of the detected output of the resolver angle θ, and arrows indicate the zero-detection timing (timing at which the period detection signal is output) of the integral. If the angle error included in the resolver angle θ has a phase difference (phase shift), the integral does not become zero at the zero-detection timing, so that the phase difference u can be estimated from the integral value.

Figure 7A:
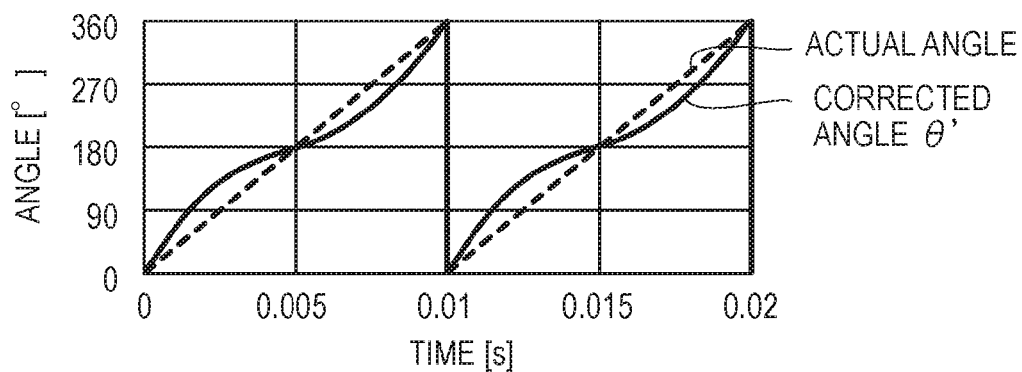
FIG. 7A is a graph showing an example operation waveform of the n-th-harmonic error estimation unit shown in FIG. 4.
Figure 7B:
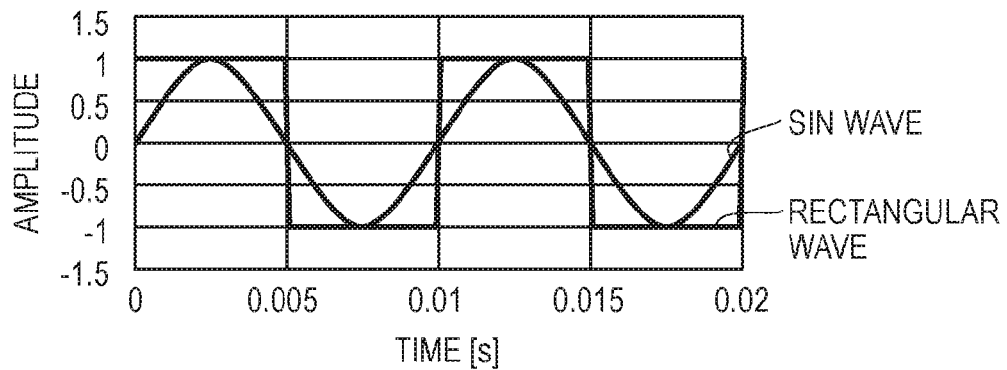
FIG. 7B is a graph showing an example operation waveform of the n-th-harmonic error estimation unit shown in FIG. 4.

FIG. 7A shows that the corrected angle θ' includes an angle error in an initial stage, that is, the corrected angle θ' is shown as a state of the resolver angle θ shown in FIG. 6A, and the actual angle is also indicated by dashed lines. FIG. 7B shows the SIN wave generated by the SIN wave generation unit 87 in the n-th-harmonic error phase detection unit 80 and the rectangular wave generated by the comparator 91.

Figure 7C:
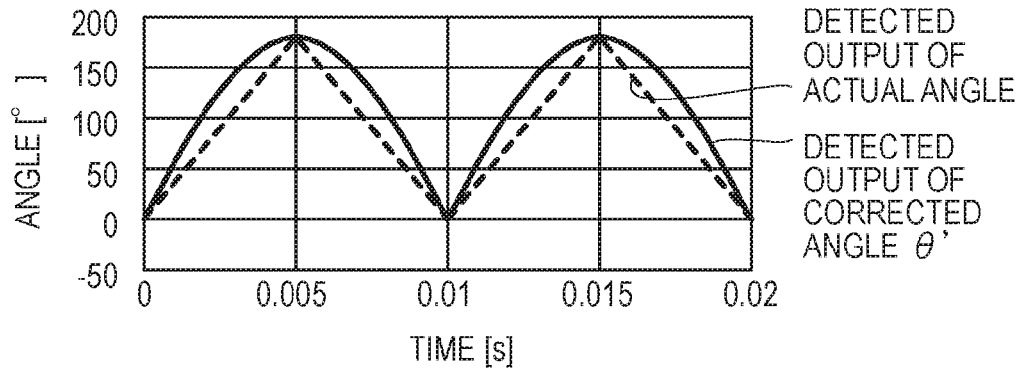
FIG. 7C is a graph showing an example operation waveform of the n-th-harmonic error estimation unit shown in FIG. 4.

FIG. 7C shows the detected output (detected output of the synchronous detector 92) of the corrected angle θ', which is obtained by synchronously detecting the corrected angle θ' by using the rectangular wave, and the detected output of the actual angle is also indicated by a dashed line. The integral of the detected output of the actual angle for a 1/n period of the electrical angle can be calculated when the duration of the 1/n period of the electrical angle is known, and FIG. 7C shows the detected output so that the calculation can be understood easily. The detected output of the actual angle can be indicated by a triangular wave having peaks at angles of 180°, as shown in FIG. 7C, and the integral of the detected output of the actual angle for a 1/n period of the electrical angle is uniquely determined from the duration of the 1/n period of the electrical angle.

In this embodiment, an error waveform is generated by estimating the amplitude and phase of the angle error for each frequency component in real time and is subtracted from the resolver angle θ to correct the angle error, as described above. Therefore, a large storage area becomes unnecessary, unlike a conventional method of making a correction with reference to the error of each rotation angle stored in the error information table.

The plurality of n-th-harmonic error estimation units 60 perform parallel processing of angle errors of different frequency components. The number of n-th-harmonic error estimation units 60 is determined as required. Generally, high-precision angle detection becomes possible if angle errors of frequency components up to or around the fourth harmonic, which means the first harmonic (fundamental wave), the second harmonic, the third harmonic, the fourth harmonic, and so on, are eliminated. Therefore, the number of n-th-harmonic error estimation units 60 is four, for example. The number of n-th-harmonic error estimation units 60 could be one to eliminate the angle error of the first harmonic alone, which generally has the largest angle error.

Second Embodiment

Figure 8:
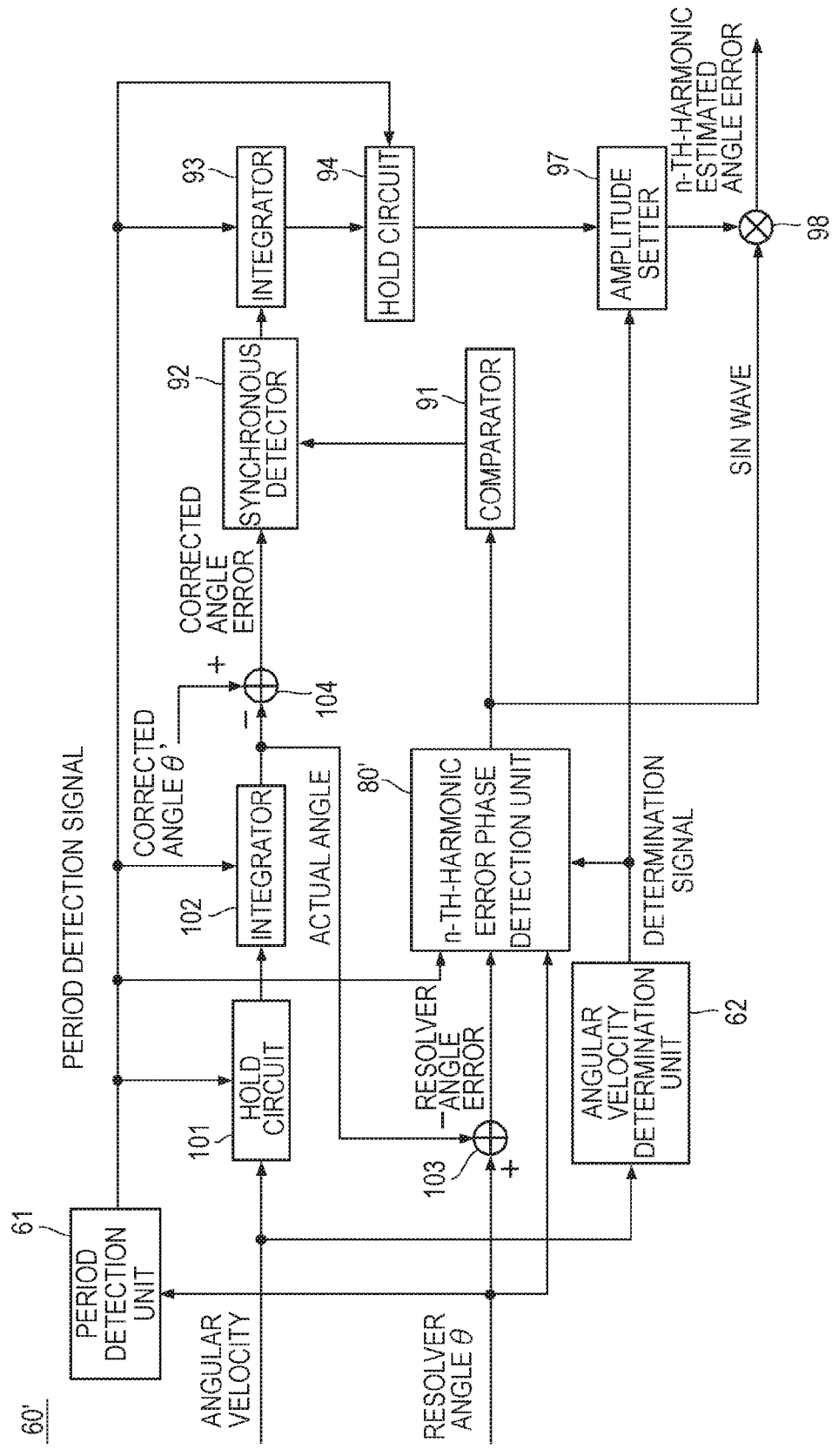
FIG. 8 is a block diagram showing another example configuration of the n-th-harmonic error estimation unit shown in FIG. 3.
Figure 9:
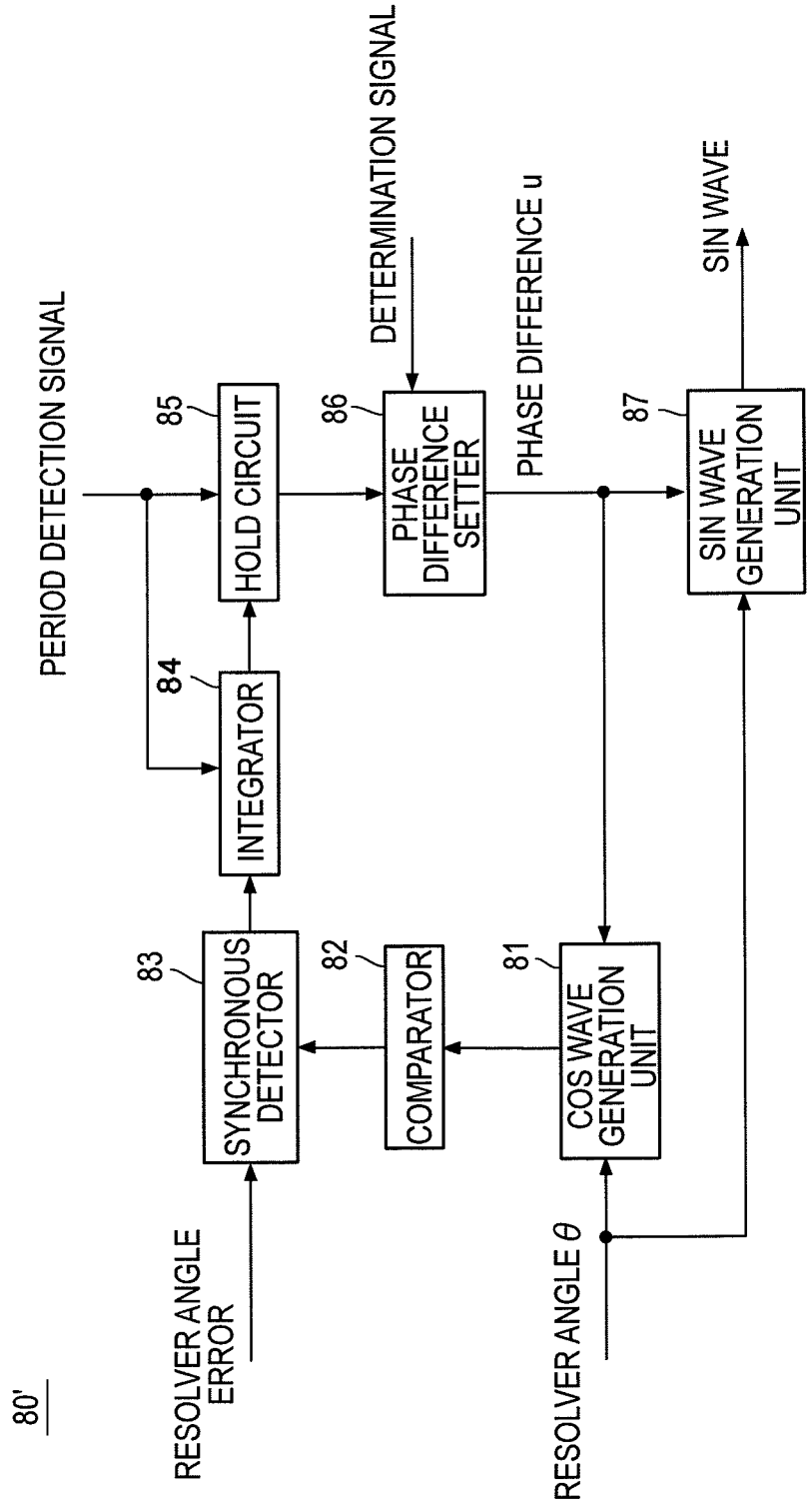
FIG. 9 is a block diagram showing details of an n-th-harmonic error phase detection unit shown in FIG. 8.

The configuration of the n-th-harmonic error estimation unit 60 is not limited to that in the first embodiment as shown in FIGS. 4 and 5, and a different configuration can be adopted. FIGS. 8 and 9 show the configuration of an n-th-harmonic error estimation unit 60' in a second embodiment.

In this embodiment, an angle error is calculated before the phase and amplitude of the angle error are estimated. The n-th-harmonic error estimation unit 60' includes a period detection unit 61, an angular velocity determination unit 62, a hold circuit 101, an integrator 102, subtractors 103, 104, an n-th-harmonic error phase detection unit 80', a comparator 91, a synchronous detector 92, an integrator 93, a hold circuit 94, an amplitude setter 97, and a multiplier 98, as shown in FIG. 8. Parts corresponding to those in FIG. 4 are denoted by the same reference numerals, and detailed description of them will be omitted.

A period detection signal output from the period detection unit 61 is input to the hold circuits 101 and 94, the integrators 102 and 93, and the n-th-harmonic error phase detection unit 80'.

An angular velocity is input to the angular velocity determination unit 62 and the hold circuit 101. The hold circuit 101 holds the angular velocity at the timing at which the period detection signal is output and outputs the held angular velocity to the integrator 102. The integrator 102 integrates the angular velocity to obtain an actual angle. The actual angle calculated by the integrator 102 is input to the subtractors 103 and 104, respectively. The subtractor 103 subtracts the actual angle from the resolver angle θ to obtain a resolver angle error. Both the resolver angle error and the resolver angle θ are input to the n-th-harmonic error phase detection unit 80'.

As shown in FIG. 9, the n-th-harmonic error phase detection unit 80' is similar to the n-th-harmonic error phase detection unit 80 shown in FIG. 5 in configuration. The difference from FIG. 5 lies in that instead of the resolver angle θ, the resolver angle error is synchronously detected. The phase difference u of the resolver angle error is estimated, and a SIN wave expressed as sin(nθ+u) is generated.

The corrected angle θ' and the actual angle are input to the subtractor 104, and the subtractor 104 subtracts the actual angle from the corrected angle θ' to obtain a corrected angle error. The corrected angle error is input to the synchronous detector 92. In this embodiment, the synchronous detector 92 synchronously detects the corrected angle error by using the rectangular wave input from the comparator 91.

The detected output from the synchronous detector 92 is input to the integrator 93, and the integrator 93 integrates the detected output for a 1/n period of the electrical angle. The integral is input to the hold circuit 94 and held there at the timing at which the period detection signal is output. The hold output of the hold circuit 94 is updated at the timing at which the period detection signal is output, and is input to the amplitude setter 97. The amplitude setter 97 estimates an error amplitude from the hold output (integral) input from the hold circuit 94 and outputs it. The error amplitude is input to the multiplier 98, and the multiplier 98 generates an n-th-harmonic estimated angle error by multiplying the SIN wave by the error amplitude.

In the second embodiment, after the angle error is calculated, an error waveform is generated by estimating the amplitude and phase of the angle error, as described above, and the amount of integration by the integrator 93 is greatly reduced in comparison with the first embodiment. In the first embodiment, the integrator 93 has to perform integration from an error-containing resolver angle θ of 0° to 360°, but in the second embodiment, integration need to be performed in just the range of angle errors (several degrees), and accordingly, the integrator 93 can be greatly reduced in size.

Figure 10A:
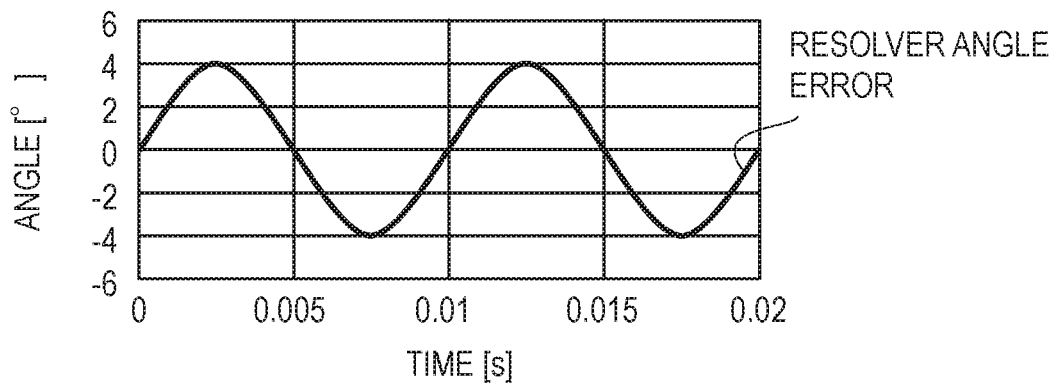
FIG. 10A is a graph showing an example operation waveform of the n-th-harmonic error phase detection unit shown in FIG. 9.
Figure 10B:
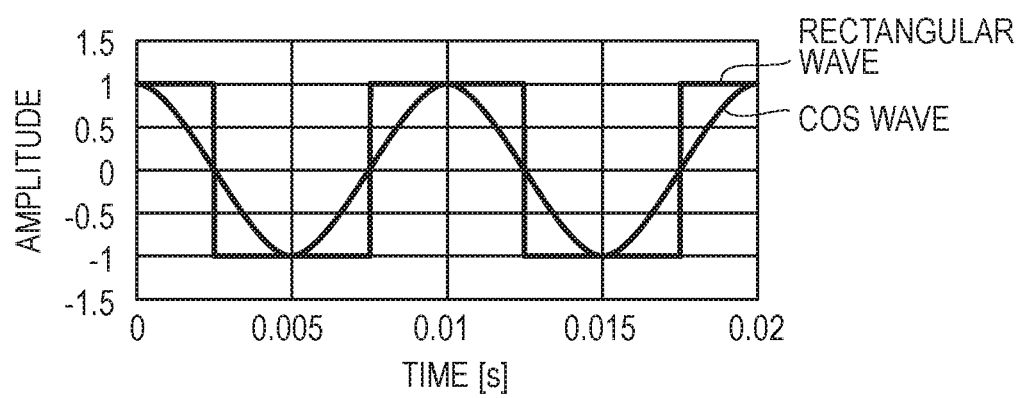
FIG. 10B is a graph showing an example operation waveform of the n-th-harmonic error phase detection unit shown in FIG. 9.
Figure 10C:
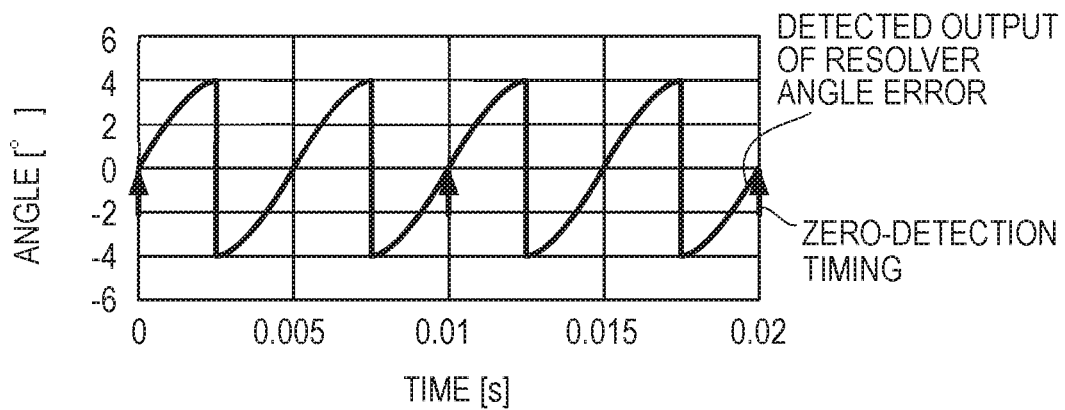
FIG. 10C is a graph showing an example operation waveform of the n-th-harmonic error phase detection unit shown in FIG. 9.

FIGS. 10A to 10C and FIGS. 11A to 11D show example waveforms in the n-th-harmonic error estimation unit 60', described above. FIGS. 10A to 10C show, in particular, example waveforms in the n-th-harmonic error phase detection unit 80'.

FIG. 10A shows the resolver angle error calculated by the subtractor 103. The resolver angle error indicated here contains the error component of the first harmonic (fundamental wave). FIG. 10B shows the COS wave generated by the COS wave generation unit 81 and the rectangular wave generated by the comparator 82. FIG. 10C shows the detected output (detected output of the synchronous detector 83) of the resolver angle error, which is obtained by synchronously detecting the resolver angle error by using the rectangular wave. Arrows in FIG. 10C indicate zero-detection timing (timing at which the period detection signal is output). If the angle error included in the resolver angle θ has a phase difference (phase shift), the integral does not become zero at the zero detection timing, and the phase difference u can be estimated from the integral value.

Figure 11A:
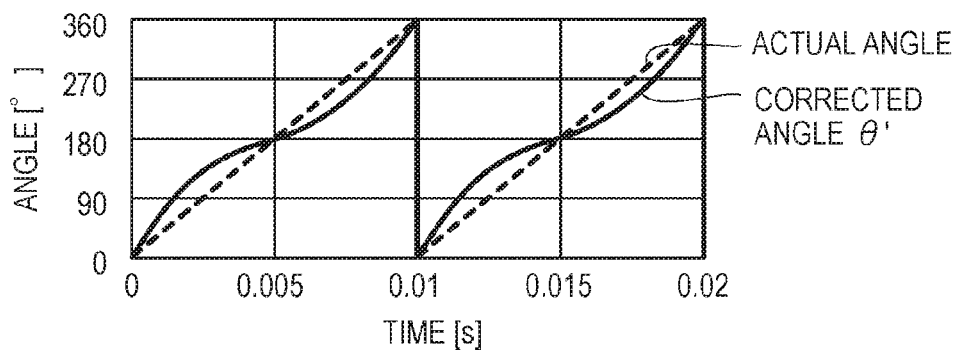
FIG. 11A is a graph showing an example operation waveform of the n-th-harmonic error estimation unit shown in FIG. 8.
Figure 11B:
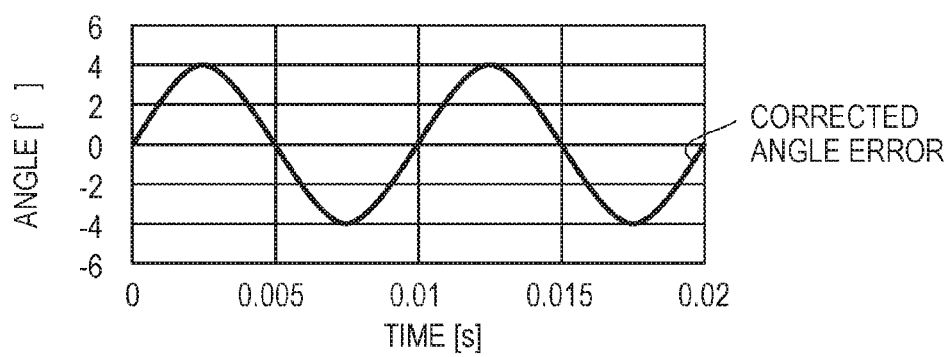
FIG. 11B is a graph showing an example operation waveform of the n-th-harmonic error estimation unit shown in FIG. 8.

Like FIG. 7A, FIG. 11A shows the corrected angle θ' in the initial stage and the actual angle. FIG. 11B shows that the corrected angle error has an error in the initial stage, and the corrected angle error is shown as a state of the resolver angle error shown in FIG. 10A.

Figure 11C:
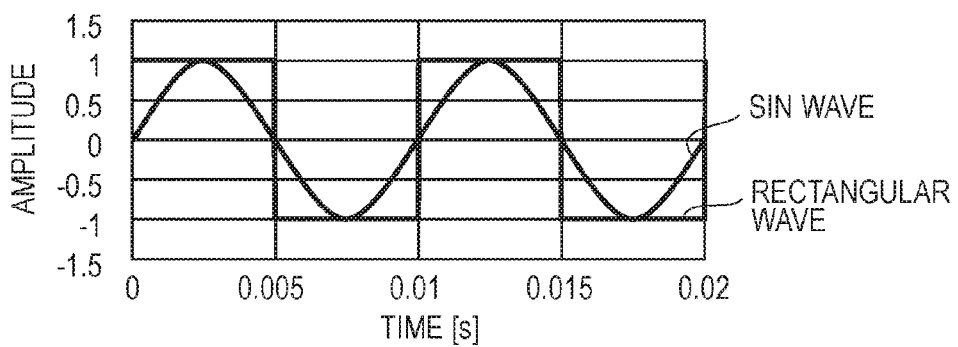
FIG. 11C is a graph showing an example operation waveform of the n-th-harmonic error estimation unit shown in FIG. 8.

FIG. 11C shows the SIN wave generated by the SIN wave generation unit 87 and the rectangular wave generated by the comparator 91.

Figure 11D:
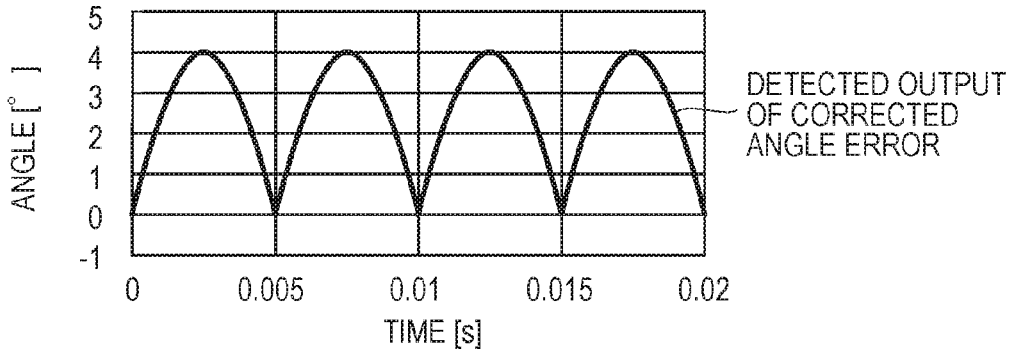
FIG. 11D is a graph showing an example operation waveform of the n-th-harmonic error estimation unit shown in FIG. 8.

FIG. 11D shows the detected output (detected output of the synchronous detector 92) of the corrected angle error, which is obtained by synchronously detecting the corrected angle error by using the rectangular wave. By integrating this detected output, the error amplitude can be estimated.

The present invention can be applied not only to resolvers but also to other angle sensors. By correcting the angle obtained from the signal of the angle sensor, on the basis of the present invention, the angle precision can be improved. For example, the present invention can be applied to angle sensors utilizing a Hall element, optical rotary encoders, and the like. The present invention uses the angular velocity output from the angle calculation unit, but the angular velocity may also be obtained from the angle.

What is claimed is:

1. A resolver device comprising:
   a resolver;
   an excitation circuit adapted to apply an excitation signal to the resolver;
   an angle calculation unit adapted to calculate a resolver angle θ from output signals of the resolver;
   an n-th-harmonic error estimation unit adapted to estimate an error component of an n-th (n>0) harmonic included in the resolver angle θ; and
   a subtraction unit adapted to subtract an n-th-harmonic estimated angle error estimated by the n-th-harmonic error estimation unit from the resolver angle θ and to output a corrected angle θ';
   the n-th-harmonic error estimation unit comprising:
   an n-th-harmonic error phase detection unit adapted to obtain a phase difference u such that an integral, for a 1/n period of an electrical angle, of a detected output obtained by synchronously detecting the resolver angle θ by using a rectangular wave obtained by comparison from a COS wave expressed as cos(nθ+u) becomes zero, and to generate and output a SIN wave expressed as sin(nθ+u) from the obtained u;
   a comparator adapted to do comparison with the SIN wave;
   a synchronous detector adapted to synchronously detect the corrected angle θ' by using a rectangular wave output from the comparator;
   an integrator adapted to integrate a detected output of the synchronous detector for a 1/n period of the electrical angle;
   an actual angle integral calculation unit adapted to calculate an integral, for a 1/n period of the electrical angle, of a detected output obtained by synchronously detecting an actual angle, assuming that the resolver angle θ has no error, by using the rectangular wave output from the comparator;
   a subtractor adapted to subtract the integral of the actual angle integral calculation unit from an integral of the integrator;
   an amplitude setter adapted to set an error amplitude from an output of the subtractor; and
   a multiplier adapted to generate and output the n-th-harmonic estimated angle error by multiplying the SIN wave by the error amplitude;
   the u and the error amplitude being updated when the resolver is rotating at a uniform velocity greater than or equal to a predetermined number of revolutions.

2. A resolver device comprising:
   a resolver;
   an excitation circuit adapted to apply an excitation signal to the resolver;
   an angle calculation unit adapted to calculate a resolver angle θ from output signals of the resolver;
   an n-th-harmonic error estimation unit adapted to estimate an error component of an n-th (n>0) harmonic included in the resolver angle θ; and
   a subtraction unit adapted to subtract an n-th-harmonic estimated angle error estimated by the n-th-harmonic error estimation unit from the resolver angle θ and to output a corrected angle θ';
   the n-th-harmonic error estimation unit comprising:
   a first integrator adapted to integrate an angular velocity obtained from the angle calculation unit to calculate an actual angle;
   a first subtractor adapted to subtract the actual angle from the resolver angle θ to calculate a resolver angle error;
   an n-th-harmonic error phase detection unit adapted to obtain a phase difference u such that an integral, for a 1/n period of an electrical angle, of a detected output obtained by synchronously detecting the resolver angle error by using a rectangular wave obtained by comparison from a COS wave expressed as cos(nθ+u) becomes zero, and to generate and output a SIN wave expressed as sin(nθ+u) from the obtained u;
   a comparator adapted to do comparison with the SIN wave;

a second subtractor adapted to subtract the actual angle from the corrected angle θ' to calculate a corrected angle error;

a synchronous detector adapted to synchronously detect the corrected angle error by using a rectangular wave output from the comparator;

a second integrator adapted to integrate a detected output of the synchronous detector for a 1/n period of the electrical angle;

an amplitude setter adapted to set an error amplitude from an integral of the second integrator; and a multiplier adapted to generate and output the n-th-harmonic estimated angle error by multiplying the SIN wave by the error amplitude;

the u and the error amplitude being updated when the resolver is rotating at a uniform velocity greater than or equal to a predetermined number of revolutions.

3. The resolver device according to claim 1, further comprising one or more n-th-harmonic error estimation units having different n values.

4. The resolver device according to claim 2, further comprising one or more n-th-harmonic error estimation units having different n values.

* * * * *